US007913379B2

(12) United States Patent
Bodenweber et al.

(10) Patent No.: US 7,913,379 B2
(45) Date of Patent: Mar. 29, 2011

(54) TOOL ASSEMBLY FOR EXTRACTING AND INSTALLING DUAL IN-LINE MEMORY MODULE CARDLETS

(75) Inventors: Paul F. Bodenweber, Kingston, NY (US); John J. Loparco, Poughkeepsie, NY (US); Thong N. Nguyen, Wappingers Falls, NY (US); Thomas Ramundo, Albany, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 525 days.

(21) Appl. No.: 12/036,664

(22) Filed: Feb. 25, 2008

(65) Prior Publication Data

US 2009/0211083 A1 Aug. 27, 2009

(51) Int. Cl.
*B23P 19/00* (2006.01)

(52) U.S. Cl. ................ 29/739; 29/758; 29/759; 29/764; 439/157; 439/160

(58) Field of Classification Search .................... 29/739, 29/737, 758, 759, 764, 854; 361/754, 759, 361/801; 439/157, 159, 160, 188, 328, 911
See application file for complete search history.

(56) References Cited

U.S. PATENT DOCUMENTS 7,254,040 B2 * 8/2007 Barina et al. .................. 361/801
7,344,402 B2 * 3/2008 Langgood et al. ............ 439/328

* cited by examiner

*Primary Examiner* — Thiem Phan
(74) *Attorney, Agent, or Firm* — Dennis Jung

(57) ABSTRACT

A tool assembly for engaging and disengaging a cardlet housing electronic components from a computer environment. The cardlet, in a preferred embodiment is a dual in-line memory module (DIMM) cardlet. The tool comprises a carrier having a handle on one end and a plurality of retention features and engaging members on an opposing side. The carrier release mechanism is secured to the carrier and the engaging members such that activating the carrier release mechanism moves the engaging members from a first to a second position such that engagement and disengagement of the carrier and said cardlet housing electronic components can be achieved. In addition, a removable latch release member is also secured to the carrier, the release member having a durable tip for engaging and disengaging latches on the computer cardlet without damaging the cardlet or its surrounding sensitive components.

17 Claims, 4 Drawing Sheets

103
141
173
130
190
103
175
175
120
100
180
110
101
140
141

TOOL ASSEMBLY FOR EXTRACTING AND INSTALLING DUAL IN-LINE MEMORY MODULE CARDLETS

BACKGROUND OF THE INVENTION

1 . Field of the Invention

This invention relates to the packaging of computing systems and more particularly to a method and assembly for removing DIMM modules.

2 . Description of Background

The industry trend has been to continuously increase the number of electronic components inside computing environments while maintaining or even reducing the environment's footprint. Computer environments can vary in range and sophistication. Simple environments can only comprise of a single computer unit while more sophisticated environments can comprise of networks of large computers that are in processing communication with one another. No matter what the size of the environment, the current industry trend has created design challenges for the developers and manufacturers of such environments. When the environments are larger and more sophisticated, however, the issues become more complex. This is because changing even the most isolated component, in such an environment, can affect so many others. This is especially true when such components are packaged together in a single assembly or housed in close proximity. A particularly difficult challenge when designing such computing system environments is the issue of maintenance and serviceability of machines.

In large computing systems, the task of replacing parts is both difficult and labor intensive. Such difficulties can impact the integrity of the entire computing environment. The requirements for installing and extracting memory cardlets are especially challenging, particularly when the cardlets are dual in-line memory module (DIMM) cardlets.

A DIMM, or dual in-line memory module, comprises a series of dynamic random access memory integrated circuits. These modules are mounted on a printed circuit board and designed for use in computers. DIMMs have become increasingly popular and have replaced SIMMs (single in-line memory modules) as the predominant type of memory module. The main difference between SIMMs and DIMMs is that conventionally, SIMMs have a 32,-bit data path, while DIMMs have a 64,-bit data path. In many instances, the system environment requires a matching pair of SIMMs to be in order to provide for the use a bus width of 64,-bits. In such a case, the processor would then need to access the two SIMMs simultaneously. DIMMs eliminate this inefficiency. Another difference is that DIMMs have separate electrical contacts on each side of the module, while the contacts on SIMMs on both sides are redundant.

The number of ranks on any DIMM is the number of independent sets of DRAMs that can be accessed simultaneously for the full data bit-width of the DIMM to be driven on the bus. The physical layout of the DRAM chips on the DIMM itself does not necessarily relate to the number of ranks. Sometimes the layout of all DRAM on one side of the DIMM PCB versus both sides is referred to as "single-sided" versus "double-sided". In most electronic systems, memory controllers are designed to access the full data bus width of the memory module at the same time.

On a 64-bit (non-ECC) DIMM made with two ranks, there would be two sets of DRAM that could be accessed at different times. Only one of the ranks can be accessed at a time, since the DRAM data bits are tied together for two loads on the DIMM. Ranks are accessed through chip selects (CS). Thus for a two rank module, the two DRAMs with data bits tied together may be accessed by a CS per DRAM.

DIMMs are currently being commonly manufactured with up to four ranks per module. It should be noted that in recent years the industry have begun to distinguish between single and dual ranked DIMMs. However, the terms "dual-sided," "double-sided," or "dual-banked" are still being used by many designers as applying to DIMMs Unfortunately due to limited space in the fixed foot prints dedicated to the system environment and because of the high mating/extracting force requirements (i.e., to mate the DIMM to its connector or to disengage the DIMM connector's latches), the tasks of inserting and extracting DIMM memory are both difficult and inefficient, leading to the potential damage to both the DIMM Cards and it's connector (SMT) joints. Consequently an improved methodology and tool is needed to support the DIMM both upon extraction, and during insertion exertion that does not provide damage potential to the DIMMs or surrounding sensitive components. In addition an improved method and assembly that can provide for a more ergonomic design can greatly help the serviceability requirements and ease system integrity issues.

SUMMARY OF THE INVENTION

The shortcomings of the prior art are overcome and additional advantages are provided through the provision of a method and incorporated tool assembly for engaging and disengaging a cardlet housing electronic components from a computer environment. The cardlet, in a preferred embodiment is a dual in-line memory module (DIMM) cardlet. The tool comprises a carrier having a handle on one end and a plurality of retention features and engaging members on an opposing side. The carrier release mechanism is secured to the carrier and the engaging members such that activating the carrier release mechanism moves the engaging members from a first to a second position such that engagement and disengagement of the carrier and said cardlet housing electronic components can be achieved. In addition, a removable latch release member is also secured to the carrier, the release member having a durable tip for engaging and disengaging latches on the computer electronic assembly without damaging the cardlet or its surrounding sensitive components.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 1A:
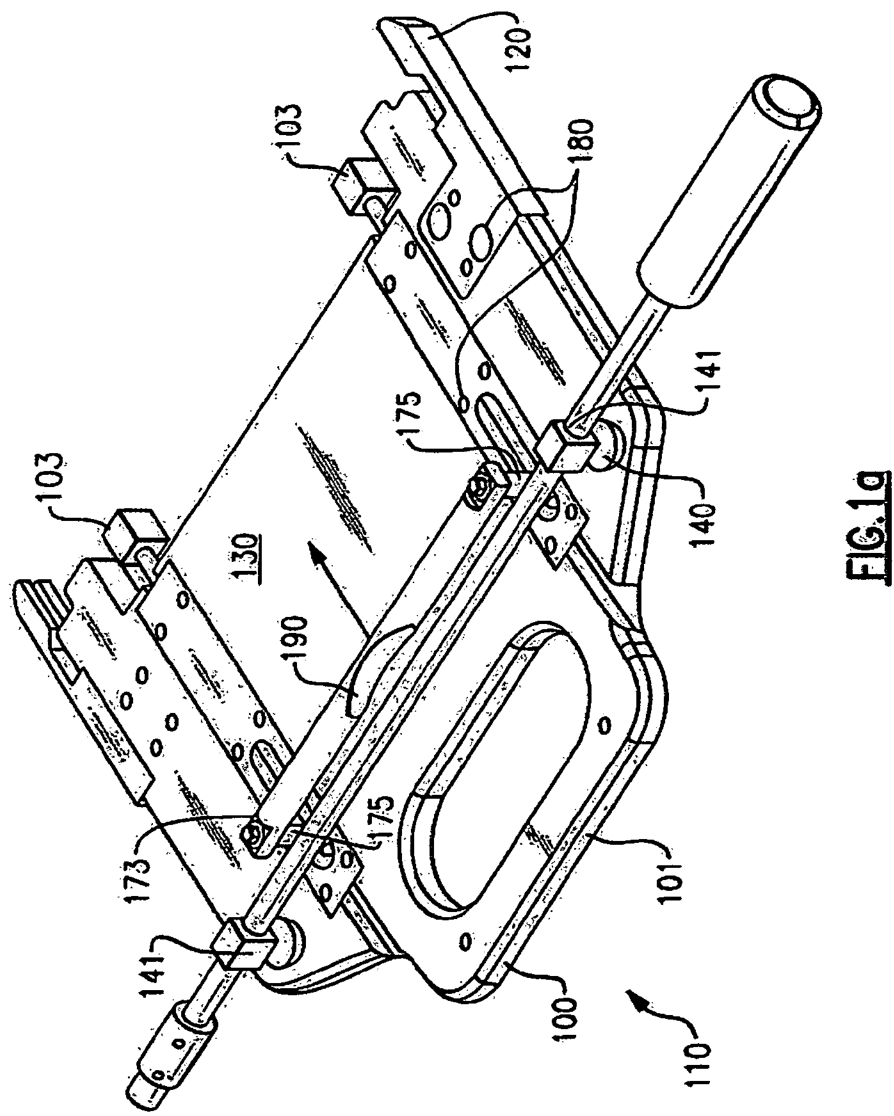
FIG. 1*a* is an isometric view illustration of a tool assembly as per one embodiment of present invention.
Figure 1B:
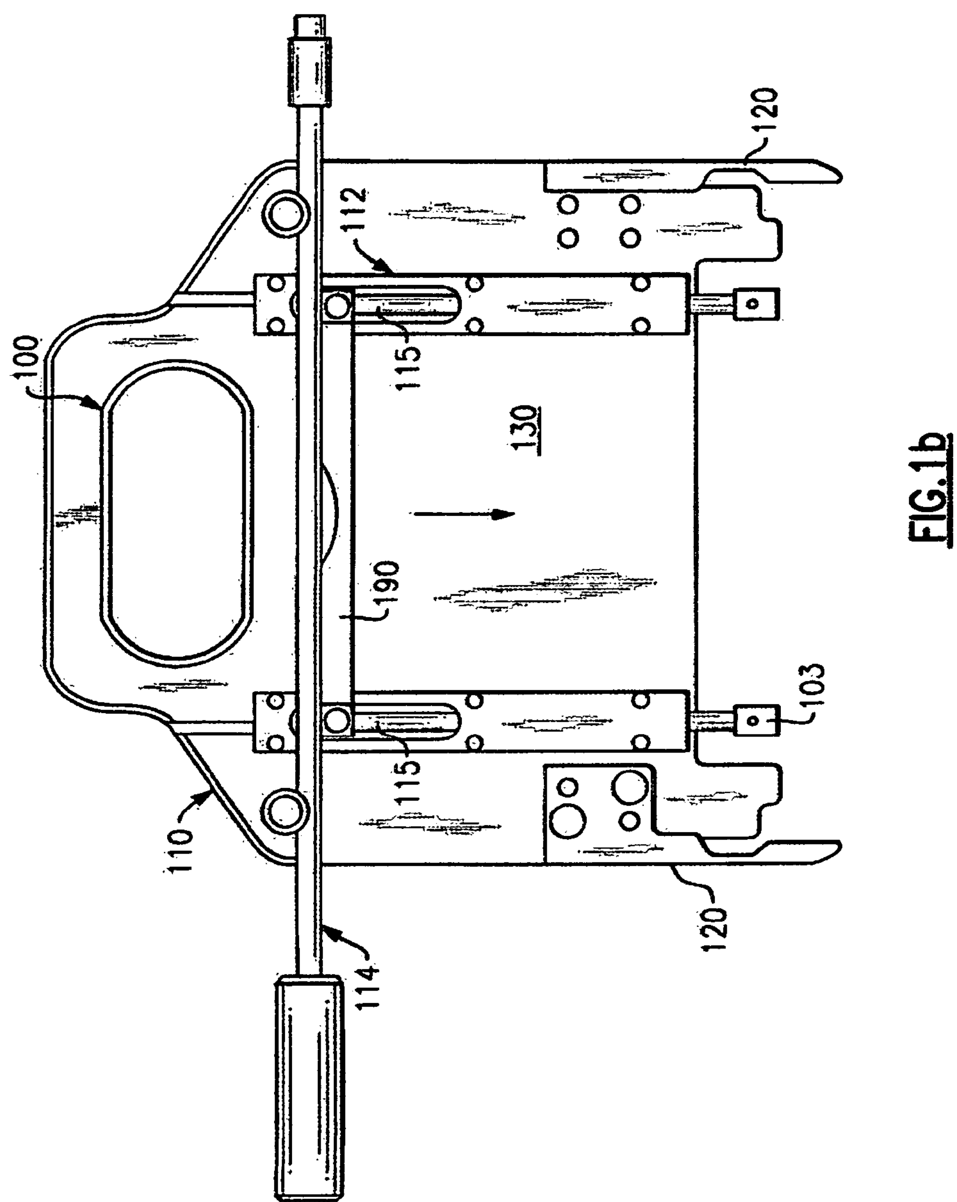
FIG. 1*b* is a front view illustration of the tool assembly as provided by the embodiment of FIG. 1*a;*

FIGS. 1*a* and 1*b* provide a first embodiment of the present invention. FIG. 1*a* provides an isometric view of the embodiment while FIG. 1*b* provides a front view illustration. The purpose behind providing two different views of the same embodiment is to show certain features more clearly which may be obstructed by one view or another.

The figures illustrate an apparatus 100 which is capable of extracting and inserting an electronic cardlet, and particularly a DIMM cardlet or memory card. In a preferred embodiment, the DIMM memory card can be a Single High, Double High, or a Quad High DIMM card. The tool 100 provides for the simple, safe plugging and unplugging of the DIMM Card without damage to itself or surrounding hardware. It should be noted that for ease of understanding and reference, in the discussion of the invention below, the removal of a DIMM memory cardlet is specifically enumerated, as opposed to a general cardlet. It should be noted that the workings of the present invention is applicable to both.

As shown in FIG. 1*a*, is a tool assembly comprised of a carrier 110 (preferably and hereinafter a DIMM carrier) having a handle 101 on one side and a plurality of retention features 120 and engagement members 103 on an opposing side. The carrier also includes a release mechanism 112 and a latch release member 114. The release mechanism 114 is secured to said engagement members 103 and drives them from a first to a second position (i.e. up and down in this case) such that the engagement and disengagement of the carrier and cardlet can be achieved.

The release member 114, has a durable tip 302 and a handle 304, preferably on opposing ends, as will be discussed later in conjunction with FIG. 3.

The carrier 110 retains the DIMM (or other such cardlets), using frictional interference between the cardlet's two side edges to the carrier's receiving tracks. This interfaced is relied upon to grip the DIMM cardlet when removing it from its protective packaging AND while plugging it into its mating connector. This will be discussed in further detail in the discussions that follow the subsequent figures.

One of the advantages that the tool assembly 100 provides is the use of the retention feature(s) 120 that enhances the tool's durability and usability. In one preferred embodiment of the present invention, the retention feature 120 comprises of a plurality of engagement features that can be removable or replaceable FIGS. 1*a* and 1*b* and referenced as 120. In one embodiment, these removable features are finger like structures (hereinafter fingers). The features/fingers 120 can be single high or double high in design to provide maximum gripping motion. In addition, the height of the feature/fingers 120 can be also be selectively adjusted to achieve maximum results.

It should be noted that in one embodiment of the present invention as provided in the figures, the carrier's release mechanism 114 is self-contained and spring-loaded to remove DIMM cardlets from the tool when placing the DIMM into its protective packaging OR when removing the tool from the DIMM cardlet once it is mated to its connector. In one embodiment, this can be achieved by enabling the carrier handle 101 to activate the mechanism as will be discussed later. The mechanism can then in turn activate the movement of the engagement features 103 to cause insertion or removal of the cardlet.

In addition, the latch release member 114, in a preferred embodiment, is a separable member and is used to release the DIMM connector's latches in the process of extracting DIMMs. In one embodiment, the design and construction of the latch release member 114 includes a durable tip to minimize damage to both the DIMM connector's latches as well as surrounding sensitive components. The release member is retained to the carrier's DIMM release mechanism.

The movement of the carrier handle 101, in one example, in the direction of the arrow 130, will cause the tool carrier to engage with the cardlet, thus causing the engagement of the fingers 120 as discussed above. In an alternate embodiment, a release button 190 or crossbar and can be used to cause the engagement of the release mechanism 114. Note that in one embodiment of the present invention, the fingers can be made from a slightly flexible material to achieve the best results.

In one embodiment, as depicted the carrier release mechanism further comprises a member 115 that moves from one position to another (i.e. up and down in this case) as directed by the force on the carrier's handle 101 to cause the engagement of the carrier 110 and the cardlet through the fingers 120 and engagement features 103.

Both the release mechanism 114 and the fingers 120 can be secured to the carrier 110 using a variety of methods as known to those skilled in the art, including but not limited to bolts, screws, nails, adhesives and other such fasteners that are collectively shown as 180.

Figure 2:
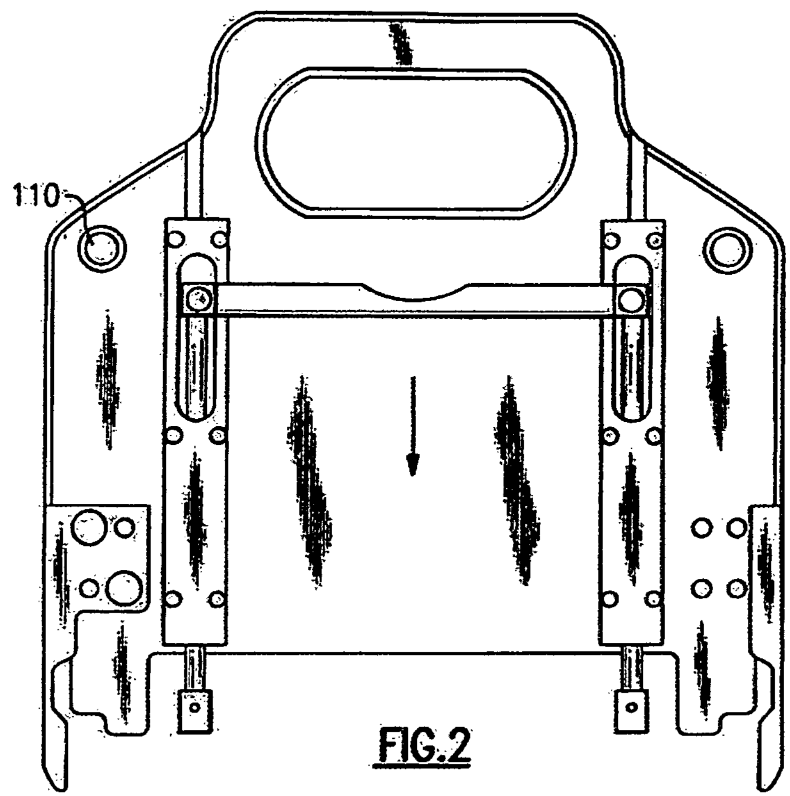
FIG. 2 is a front view illustration of the carrier as per embodiments of FIGS. 1*a* and 1*b;*

FIGS. 2 though 4 are illustrations of the different features of the apparatus discussed in conjunction with FIGS. 1*a* and 1*b* above used to further achieve an understanding of the methodology used in conjunction with the apparatus as will be presently discussed.

Figure 4:
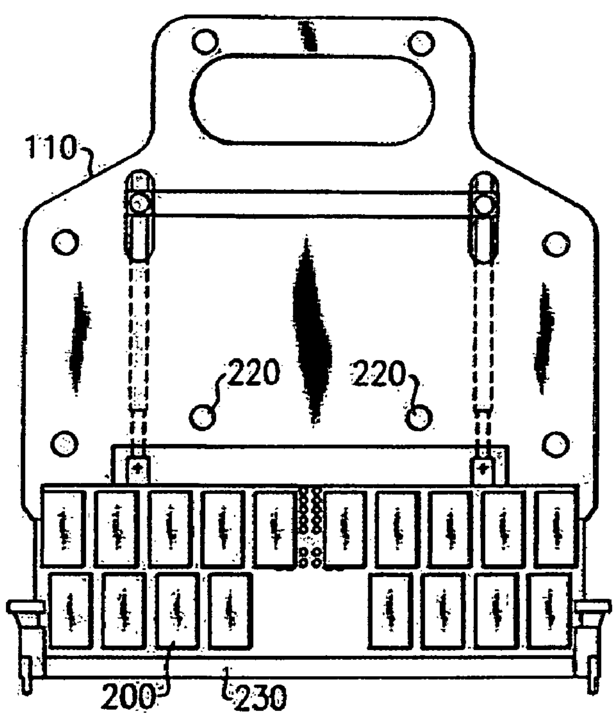
FIG. 4 is the tool assembly of the embodiments of FIGS. 1*a* and 1*b* while being engaged with DIMM cardlets.
Figure 5:
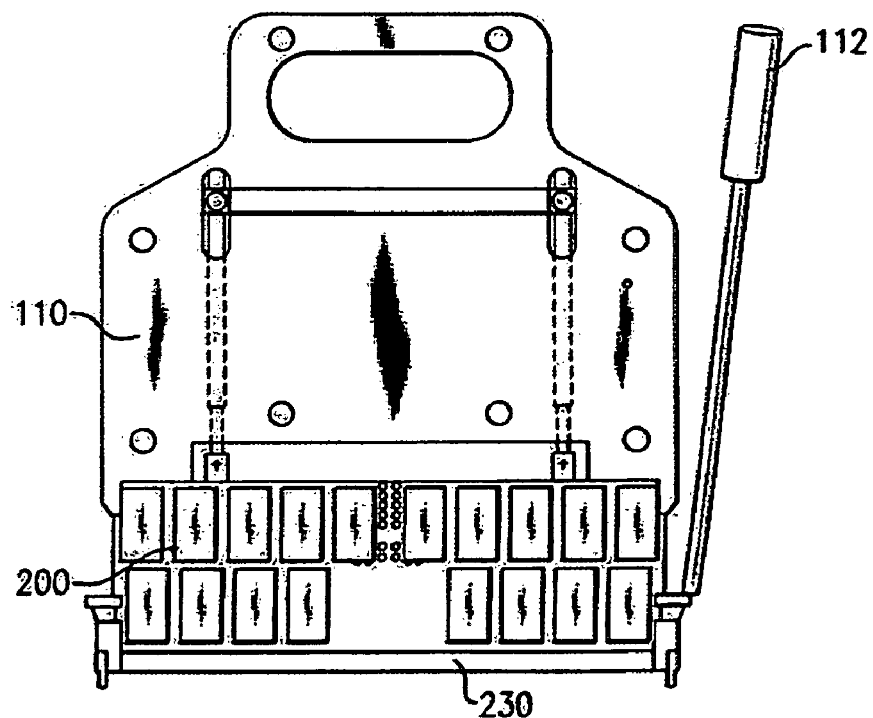
FIG. 5 is the tool assembly of the embodiments of FIGS. 1*a* and 1*b* while being disengaged from DIMM cardlets.

FIG. 2 provides an illustration of the DIMM tool carrier 110. The tool carrier will be inserted to where the removal of the DIMM is to take place. As shown in FIGS. 4 and 5, the insertion and removal of the DIMM will be contacted in similar fashion as will be discussed in FIGS. 4 and 5 below.

For ease of understanding, let us consider the case for the removal of the DIMM or the insertion of the carrier 110 as depicted in the illustration of FIG. 4. To remove or insert the carrier, the carrier's handle 101 can be simply pushed. In an alternate embodiment, a release button 190 or cross bar can be also pushed in the direction of the arrow 130 to enable the engagement of the carrier 110 with the cardlet.

In ether case, in this example, once the carrier is inserted, the DIMM is engaged and then subsequently removed by aligning the carrier 110 to the cardlet's edges 220 and sliding into place. It should be noted that in doing so, the frictional interface between the carrier fingers 120 and the cardlet edges grips the cardlet 200 and retains while extracting the DIMM from its protective packaging and while inserting to its mating connector 230.

The DIMM can then be transported from one location to another for servicing, or if desired from one machine or one environment to another for reinsertion as will be discussed in conjunction with FIG. 5 below.

Before discussing, FIG. 5, a quick discussion of FIG. 3 will be made as it is later useful in understanding the operation of the deletion operation as will be discussed in relation to the operation depicted in FIG. 5.

Figure 3:
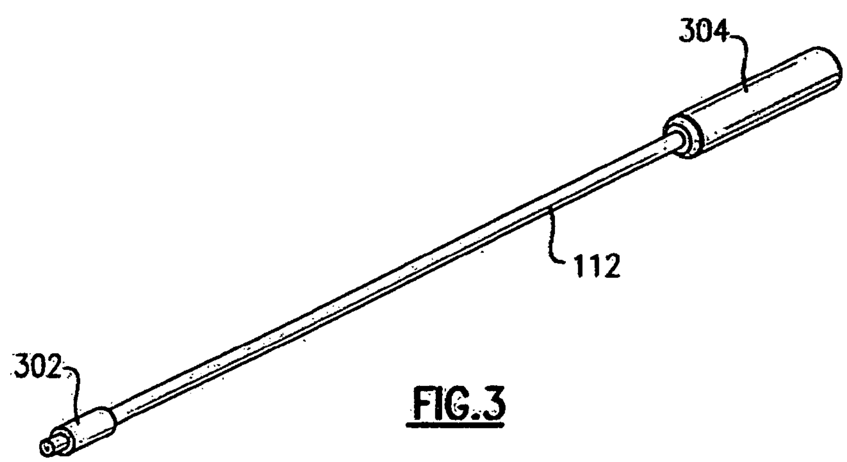
FIG. 3 is an illustration of a latch release member as per embodiments of FIGS. 1*a* and 1*b;*

FIG. 3 is an illustration of the latch release 112. Referring back to FIG. 1*a*, it should be pointed out that (self-contained) release mechanism 114 can also includes securing mechanism 175 for retention of this separable release member 112.

Also additional securing members 173 and 140 can also be secured to the carrier 110 to enable better securing of the latch release 112 during transportation.

Referring back to FIG. 3. in a preferred embodiment, the latch release 112 has a durable tip 302 and a handle 304 as shown. The tip is for removal of the DIMM and includes features that will prevent damage to the DIMM cardlet or surrounding sensitive components.

In addition, in one embodiment, the latch release 112 can be activated by removing it manually from the carrier 110 and pushing on cross-bar while lightly supporting the DIMM carrier. The carrier tip can be used to further engage the cardlet sides as will be discussed further presently.

In FIG. 5, the extraction operation is shown. As way of an example, let us consider that the DIMM cardlet of FIG. 4, was removed from a computer in one environment—hereinafter Machine A—and now is to be reinserted into a different computer in a second environment—hereinafter Machine B. The carrier 110 with DIMM cardlet attached was then transported between the two locations (first to second environment) easily as the DIMM and carrier 110 make a solid and secure single unit when engaged.

It should be noted that the latch release 112 is also firmly secured to the carrier, so that the carrier unit including the DIMM cardlet can be transported together. In one embodiment, of the present invention the carrier 110 can further comprise a holding mechanism 140 which can include one or more holders 140 that keep the rod like structure in place as shown. Other alternative arrangements can also be incorporated as known to those skilled in the art.

Once the DIMM cardlet and the carrier 110 are in the desired location in the second environment and ready to be installed in machine B, the process of extraction of the carrier from the DIMM cardlet can then be explained as follows.

Referring to FIG. 5, to perform the DIMM extraction operation, the latch 112 is first removed from the carrier release mechanism 114. It is also possible in alternate embodiments to have separate release buttons for the latch release 112 to automatically eject it from the carrier 110.

After the latch release 112 is removed from the mechanism 114, the carrier should be then aligned with the cardlet edges and disposed (slide) into its proper location. In doing so, the frictional interface between the fingers and the cardlet edges grips the cardlet and retains while extracting the DIMM from its connector and while dispensing it into its protective packaging.

Thereafter, while firmly supporting at the carrier handle, the latch release 112 can be placed into the receiving member one of the DIMM connector latches and appropriate force applied. In one embodiment, this would include the application of an axial force—until the two mating halves are unlatched. This action will cause a partial ejection of the DIMM. The same procedure can then be conducted on the other parallel latch.

Once the carrier with the DIMM cardlet 200 is free from the package, the tool can then be aligned to the DIMM's protective packaging. Then DIMM will then be disposed in its mating counterpart 230 and dispenses by pushing on the release mechanism's button (i.e. cross-bar here) 190, thereby ejecting the DIMM from the carrier 110. It should be noted that as delineated before, the cross-bar/button 190 provides a "hand-free" ejection option such that the tool the carrier includes a self-contained release mechanism for ejection or disengagement of a DIMM from the carrier.

It should also be noted that in a preferred embodiment of the present invention, the carrier is fabricated out of an anti-static material.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A tool assembly used for engaging and disengaging a cardlet housing electronic components from a computer environment, comprising:

a carrier having a handle on one end and a plurality of retention features and engaging members on an opposing side;

a carrier release mechanism secured to said carrier and said engaging members such that activating said carrier release mechanism moves said engaging members from a first to a second position such that engagement and disengagement of said carrier and said cardlet housing electronic components can be achieved; and a removable latch release member secured to said carrier, said release member having a durable tip for engaging and disengaging latches on said computer cardlet.

2. The tool of claim 1 wherein said cardlet is a dual in-line memory module (DIMM).

3. The tool of claim 2, wherein said retention features are removable.

4. The tool of claim 3, wherein said retention features are on both side of said carrier such that they later align with cardlet sides.

5. The tool of claim 4, wherein said retention features are fingers.

6. The tool of claim 5, wherein said engagement fingers enable the locking of said DIMM cardlet and said carrier so that they can be transported from one location using force of friction.

7. The tool of claim 6, wherein said release mechanism includes a securing mechanism for further securing said latch release to said carrier.

8. The tool of claim 6, wherein said fingers are single high.

9. The tool of claim 6, wherein said fingers are double high in design to provide maximum gripping motion.

10. The tool of claim 6, wherein height of said fingers can be selectively adjusted to achieve maximum retention.

11. The tool of claim 5, wherein said self-contained release mechanism also includes retention members for retention of said removable release member.

12. The tool of claim 5, wherein said release member has a handle and a durable tip on opposing sides, said durable tip fabricated such that when used it does not damage said DIMM cardlet or surrounding sensitive components.

13. The tool of claim 2, wherein said carrier includes a self-contained release mechanism for later disengagement of said DIMM from said carrier.

14. The tool of claim 2, wherein said release mechanism is self-contained and spring-loaded so as to insert or remove said DIMM cardlets from said carrier when placing said DIMM into its or away from its protective packaging.

15. The tool of claim 2, wherein said release mechanism and said retention features are secured to said carrier via fasteners.

16. The tool of claim 2, wherein said tool is fabricated from an anti-static material.

17. The tool of claim 2, wherein said carrier can further include a holding mechanism with one or more holders for securing said latch release to said carrier.

* * * * *